US011537532B2

(12) United States Patent
Chachad et al.

(10) Patent No.: US 11,537,532 B2
(45) Date of Patent: *Dec. 27, 2022

(54) LOOKAHEAD PRIORITY COLLECTION TO SUPPORT PRIORITY ELEVATION

(71) Applicant: TEXAS INSTRUMENTS INCORPORATED, Dallas, TX (US)

(72) Inventors: Abhijeet Ashok Chachad, Plano, TX (US); Raguram Damodaran, Plano, TX (US); Ramakrishnan Venkatasubramanian, Plano, TX (US); Joseph Raymond Michael Zbiciak, San Jose, CA (US)

(73) Assignee: Texas Instmments Incorporated, Dallas, TX (US)

( * ) Notice: Subject to any disclaimer, the term of this patent is extended or adjusted under 35 U.S.C. 154(b) by 130 days.

This patent is subject to a terminal disclaimer.

(21) Appl. No.: 16/916,239

(22) Filed: Jun. 30, 2020

(65) Prior Publication Data

US 2020/0401532 A1 Dec. 24, 2020

Related U.S. Application Data

(63) Continuation of application No. 15/991,241, filed on May 29, 2018, now Pat. No. 10,713,180, which is a
(Continued)

(51) Int. Cl.
*G06F 9/30* (2018.01)
*G06F 12/1081* (2016.01)
(Continued)

(52) U.S. Cl.
CPC ........ *G06F 12/1081* (2013.01); *G06F 1/3296* (2013.01); *G06F 7/483* (2013.01);
(Continued)

(58) Field of Classification Search
CPC .................................................... G06F 9/3012
See application file for complete search history.

(56) References Cited

U.S. PATENT DOCUMENTS 5,220,653 A 6/1993 Miro
5,542,088 A 7/1996 Jennings et al.
(Continued)

OTHER PUBLICATIONS

"TMS320C6678 Multicore Fixed and Floating-Point Digital Signal Processor", Data Manual, SPRS691, Texas Instruments Incorporated, Nov. 2010, pp. 1-259.
(Continued)

*Primary Examiner* — Charlie Sun
(74) *Attorney, Agent, or Firm* — Brian D. Graham; Frank D. Cimino

(57) ABSTRACT

A queuing requester for access to a memory system is provided. Transaction requests are received from two or more requestors for access to the memory system. Each transaction request includes an associated priority value. A request queue of the received transaction requests is formed in the queuing requester. Each transaction request includes an associated priority value. A highest priority value of all pending transaction requests within the request queue is determined. An elevated priority value is selected when the highest priority value is higher than the priority value of an oldest transaction request in the request queue; otherwise the priority value of the oldest transaction request is selected. The oldest transaction request in the request queue with the selected priority value is then provided to the memory system. An arbitration contest with other requesters for access to the memory system is performed using the selected priority value.

20 Claims, 8 Drawing Sheets

Related U.S. Application Data continuation of application No. 13/230,131, filed on Sep. 12, 2011, now abandoned.

(60) Provisional application No. 61/387,283, filed on Sep. 28, 2010.

(51) Int. Cl.

| | | |
|---|---|---|
| *G06F 7/483* | (2006.01) | |
| *H03M 13/35* | (2006.01) | |
| *H03M 13/29* | (2006.01) | |
| *G06F 11/10* | (2006.01) | |
| *G06F 13/16* | (2006.01) | |
| *G06F 13/18* | (2006.01) | |
| *H03K 19/00* | (2006.01) | |
| *G06F 1/3296* | (2019.01) | |
| *H03K 21/00* | (2006.01) | |
| *G06F 12/02* | (2006.01) | |
| *G06F 12/12* | (2016.01) | |
| *G06F 12/0811* | (2016.01) | |
| *G06F 12/0815* | (2016.01) | |
| *G06F 13/364* | (2006.01) | |

(52) U.S. Cl.
CPC ........ *G06F 9/3012* (2013.01); *G06F 11/1064* (2013.01); *G06F 12/0246* (2013.01); *G06F 12/0811* (2013.01); *G06F 12/0815* (2013.01); *G06F 12/12* (2013.01); *G06F 13/1605* (2013.01); *G06F 13/18* (2013.01); *H03K 19/0016* (2013.01); *H03K 21/00* (2013.01); *H03M 13/2903* (2013.01); *H03M 13/353* (2013.01); *G06F 13/1652* (2013.01); *G06F 13/1657* (2013.01); *G06F 13/1663* (2013.01); *G06F 13/364* (2013.01); *G06F 2212/1021* (2013.01); *G06F 2212/1032* (2013.01); *G06F 2212/221* (2013.01); *G06F 2212/2532* (2013.01); *G06F 2212/283* (2013.01); *G06F 2212/608* (2013.01); *Y02D 10/00* (2018.01); *Y02D 30/50* (2020.08)

(56) References Cited

U.S. PATENT DOCUMENTS

| | | | |
|---|---|---|---|
| 5,619,726 | A | 4/1997 | Seconi et al. |
| 8,151,008 | B2 | 4/2012 | Simon et al. |
| 8,189,470 | B2 | 5/2012 | Nakashima et al. |
| 8,370,590 | B2 | 2/2013 | Mogi et al. |
| 8,826,280 | B1 * | 9/2014 | Robertson ............ G06Q 10/103 718/100 |
| 9,052,375 | B2 | 6/2015 | Sampigethaya et al. |
| 2002/0161978 | A1 | 10/2002 | Apostol et al. |
| 2003/0033461 | A1 | 2/2003 | Malik et al. |
| 2003/0223453 | A1 * | 12/2003 | Staler ..................... H04L 49/90 370/444 |
| 2003/0236963 | A1 | 12/2003 | Ryken |
| 2004/0172631 | A1 | 9/2004 | Howard |
| 2010/0122067 | A1 | 5/2010 | Lindholm et al. |
| 2010/0131718 | A1 | 5/2010 | Uchiyama |
| 2011/0238941 | A1 | 9/2011 | Xu et al. |
| 2011/0246688 | A1 | 10/2011 | Vaz |
| 2012/0054760 | A1 | 3/2012 | Chung |
| 2012/0072673 | A1 | 3/2012 | Chirca et al. |

OTHER PUBLICATIONS

Comisky et al., "A Scalable High-Performance DMA Architecture for DSP Applications", 2000 IEEE, pp. 414-419.
Associate, Wiktionary, retrieved on Dec. 12, 2014, https:/en.wiktionary.org/wiki/associate, pp. 1-4.
Transaction, Wiktionary, retrieved on Mar. 5, 2015, pp. 1-3.
Lower bounds on sorting & Standard collection ADTs, 2006, pp. 1-3.
Li et al., "Disk Scheduling with Dynamic request Priorities", 1996, pp. 1-21.

* cited by examiner

LOOKAHEAD PRIORITY COLLECTION TO SUPPORT PRIORITY ELEVATION

CROSS-REFERENCE TO RELATED APPLICATION(S)

The present application is a continuation of U.S. patent application Ser. No. 15/991,241, filed on May 29, 2018, which is a continuation of U.S. patent application Ser. No. 13/230,131, filed on Sep. 12, 2011, now abandoned, which claims priority to U.S. Provisional Application No. 61/387,283, filed on Sep. 28, 2010, each of which is hereby incorporated by reference in its entirety.

FIELD OF THE INVENTION

This invention generally relates to management of memory access by multiple requesters, and in particular to access to a shared memory resource in a system on a chip with multiple cores.

BACKGROUND OF THE INVENTION

System on Chip (SoC) is a concept that strives to integrate more and more functionality into a given device. This integration can take the form of either hardware or solution software. Performance gains are traditionally achieved by increased clock rates and more advanced processor nodes. Many SoC designs pair a digital signal processor (DSP) with a reduced instruction set computing (RISC) processor to target specific applications. A more recent approach to increasing performance has been to create multi-core devices. In this scenario, management of competition for processing resources is typically resolved using a priority scheme.

BRIEF DESCRIPTION OF THE DRAWINGS

Particular embodiments in accordance with the invention will now be described, by way of example only, and with reference to the accompanying drawings.

Figure 1:
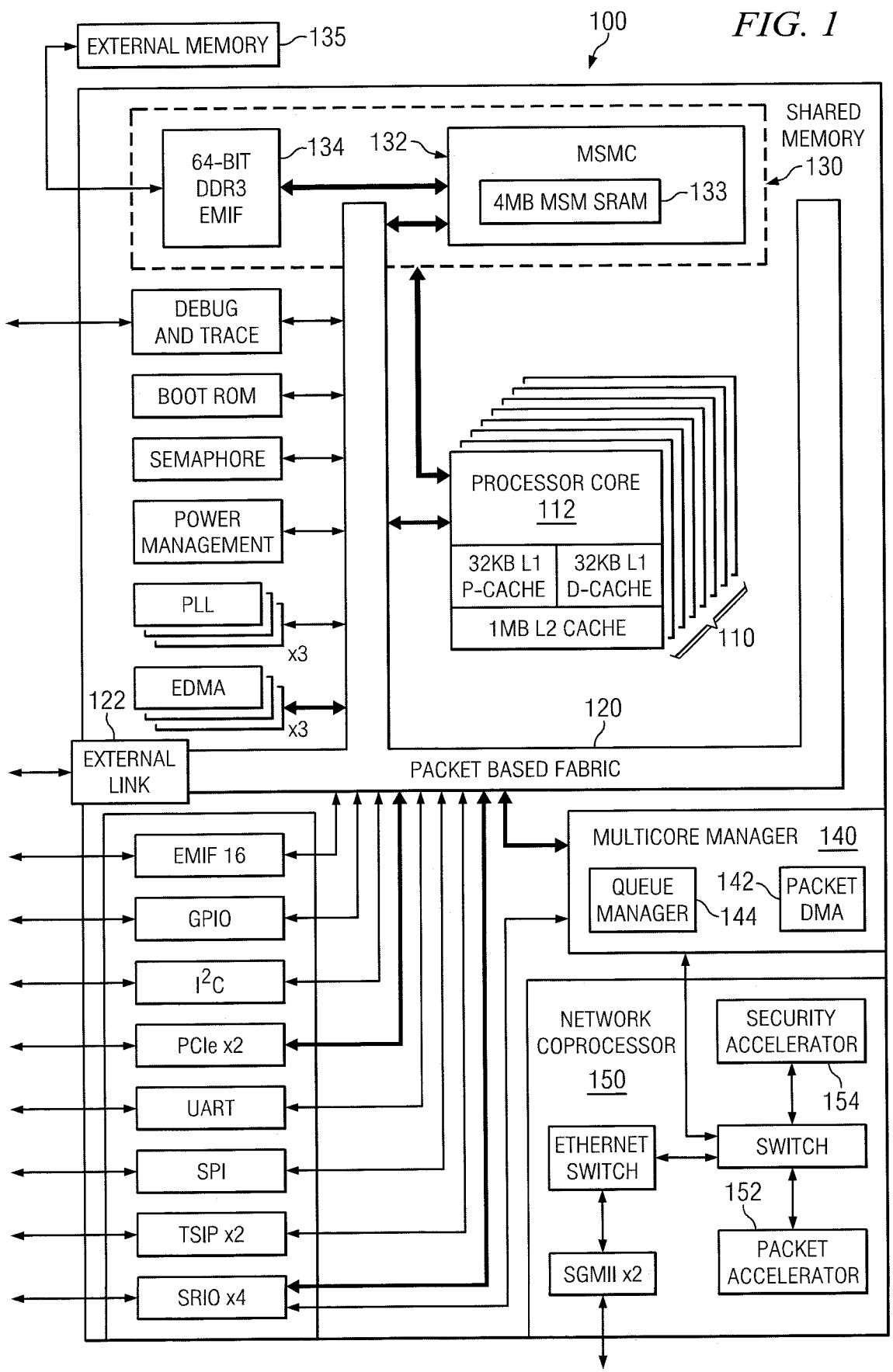
FIG. 1 is a functional block diagram of a system on chip (SoC) that includes an embodiment of the invention.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

High performance computing has taken on even greater importance with the advent of the Internet and cloud computing. To ensure the responsiveness of networks, online processing nodes and storage systems must have extremely robust processing capabilities and exceedingly fast data-throughput rates. Robotics, medical imaging systems, visual inspection systems, electronic test equipment, and high-performance wireless and communication systems, for example, must be able to process an extremely large volume of data with a high degree of precision. A multi-core architecture that embodies an aspect of the present invention will be described herein. In a typically embodiment, a multi-core system is implemented as a single system on chip (SoC). As used herein, the term "core" refers to a processing module that may contain an instruction processor, such as a digital signal processor (DSP) or other type of microprocessor, along with one or more levels of cache that are tightly coupled to the processor.

A processor module, referred to as a core, that includes a processor and a memory system is intended for use in multi-core system architecture will be described in more detail below. Each core device includes several modules that may request memory transactions and therefore implements a priority scheme both within each core device and at the interconnect fabric interface where multiple core devices can communicate with each other and other devices, such as memory controllers and hardware accelerators.

A multi-level cache controller within a core module may process different types of transfer requests from multiple requestors that may be targeted to different resources. In a multi-core scenario, these transfers may be divided into two categories: 1) local core central processing unit (CPU) generated, and 2) external master generated. In an embodiment that will be described in more detail below, the CPU generated transactions may target a local static random access memory (SRAM) within the core module or shared resources located elsewhere in the SoC. CPU transactions and DMA transactions may both be targeted for a same resource, such as SRAM that may also be configured as a level 2 (L2) cache.

An External Direct Memory Access (EDMA) interface, also known as the Master DMA (MDMA) interface of each core device presents a single request per cycle with a single priority to an external interconnect fabric. In a case where a low priority request is present on the MDMA interface a higher priority request could remain stalled inside the memory system of the device. In order to minimize such a stall, a concept of elevated priority is provided. Priority elevation allows a high priority request in the core device's memory system to communicate and propagate its priority directly to the MDMA interface even while it remains stalled, effectively elevating the priority of all older requests that are in a request queue, until the high priority request reaches the interface itself. The concept of elevated priority changes the arbitration in the multi-core environment from arbitration between individual requests to arbitration between cores. The difference is subtle, but important. In the first case, an entire memory system is represented by the single request currently present at the MDMA interface. In the second case, through elevated priority, the entire memory system is represented when arbitrating with other devices.

The core device's memory system implements a hierarchical lookahead priority collection mechanism to calculate the overall priority of the core's entire memory system and if necessary, to elevate the priority of the oldest transaction in the system, namely the transaction present at the EDMA boundary, as will be described in more detail below.

FIG. 1 is a functional block diagram of a system on chip (SoC) 100 that includes an embodiment of the invention. System 100 is a multi-core SoC that includes a set of processor modules 110 that each include a processor core, level one (L1) data and instruction caches, and a level two (L2) cache. In this embodiment, there are eight processor modules 110; however other embodiments may have fewer or greater number of processor modules. In this embodiment, each processor core is a digital signal processor (DSP); however, in other embodiments other types of processor cores may be used. A packet-based fabric 120 provides high-speed non-blocking channels that deliver as much as 2 terabits per second of on-chip throughput. Fabric 120 interconnects with shared memory system 130 to provide an extensive two-layer memory structure in which data flows freely and effectively between processor modules 110, as will be described in more detail below. An example of SoC 100 is embodied in an SoC from Texas Instruments, and is described in more detail in "TMS320C6678—Multi-core Fixed and Floating-Point Signal Processor Data Manual", SPRS691, November 2010, which is incorporated by reference herein.

External link 122 provides direct chip-to-chip connectivity for local devices, and is also integral to the internal processing architecture of SoC 100. External link 122 is a fast and efficient interface with low protocol overhead and high throughput, running at an aggregate speed of 50 Gbps (four lanes at 12.5 Gbps each). Working in conjunction with a routing manager 140, link 122 transparently dispatches tasks to other local devices where they are executed as if they were being processed on local resources.

There are three levels of memory in the SoC 100. Each processor module 110 has its own level-1 program (L1P) and level-1 data (L1D) memory. Additionally, each module 110 has a local level-2 unified memory (L2). Each of the local memories can be independently configured as memory-mapped SRAM (static random access memory), cache or a combination of the two.

In addition, SoC 100 includes shared memory 130, comprising internal memory 133 and optional external memory 135 connected through the multi-core shared memory controller (MSMC) 132. MSMC 132 allows processor modules 110 to dynamically share the internal and external memories for both program and data. The MSMC internal RAM 133 offers flexibility to programmers by allowing portions to be configured as shared level-2 RAM (SL2) or shared level-3 RAM (SL3). SL2 RAM is cacheable only within the local L1P and L1D caches, while SL3 is additionally cacheable in the local L2 caches.

External memory may be connected through the same memory controller 132 as the internal shared memory via external memory interface 134, rather than to chip system interconnect as has traditionally been done on embedded processor architectures, providing a fast path for software execution. In this embodiment, external memory may be treated as SL3 memory and therefore cacheable in L1 and L2.

SoC 100 may also include several co-processing accelerators that offload processing tasks from the processor cores in processor modules 110, thereby enabling sustained high application processing rates. SoC 100 may also contain an Ethernet media access controller (EMAC) network coprocessor block 150 that may include a packet accelerator 152 and a security accelerator 154 that work in tandem. The packet accelerator speeds the data flow throughout the core by transferring data to peripheral interfaces such as the Ethernet ports or Serial RapidIO (SRIO) without the involvement of any module 110's DSP processor. The security accelerator provides security processing for a number of popular encryption modes and algorithms, including: IPSec, SCTP, SRTP, 3GPP, SSL/TLS and several others.

Multi-core manager 140 provides single-core simplicity to multi-core device SoC 100. Multi-core manager 140 provides hardware-assisted functional acceleration that utilizes a packet-based hardware subsystem. With an extensive series of more than 8,000 queues managed by queue manager 144 and a packet-aware DMA controller 142, it optimizes the packet-based communications of the on-chip cores by practically eliminating all copy operations.

The low latencies and zero interrupts ensured by multi-core manager 140, as well as its transparent operations, enable new and more effective programming models such as task dispatchers. Moreover, software development cycles may be shortened significantly by several features included in multi-core manager 140, such as dynamic software partitioning. Multi-core manager 140 provides "fire and forget" software tasking that may allow repetitive tasks to be defined only once, and thereafter be accessed automatically without additional coding efforts.

Two types of buses exist in SoC 100 as part of packet based switch fabric 120: data buses and configuration buses. Some peripherals have both a data bus and a configuration bus interface, while others only have one type of interface. Furthermore, the bus interface width and speed varies from peripheral to peripheral. Configuration buses are mainly used to access the register space of a peripheral and the data buses are used mainly for data transfers. However, in some cases, the configuration bus is also used to transfer data. Similarly, the data bus can also be used to access the register space of a peripheral. For example, DDR3 memory controller 134 registers are accessed through their data bus interface.

Processor modules 110, the enhanced direct memory access (EDMA) traffic controllers, and the various system peripherals can be classified into two categories: masters and slaves. Masters are capable of initiating read and write transfers in the system and do not rely on the EDMA for their data transfers. Slaves on the other hand rely on the EDMA to perform transfers to and from them. Examples of masters include the EDMA traffic controllers, serial rapid I/O (SRIO), and Ethernet media access controller 150. Examples of slaves include the serial peripheral interface (SPI), universal asynchronous receiver/transmitter (UART), and inter-integrated circuit (I2C) interface.

Figure 2:
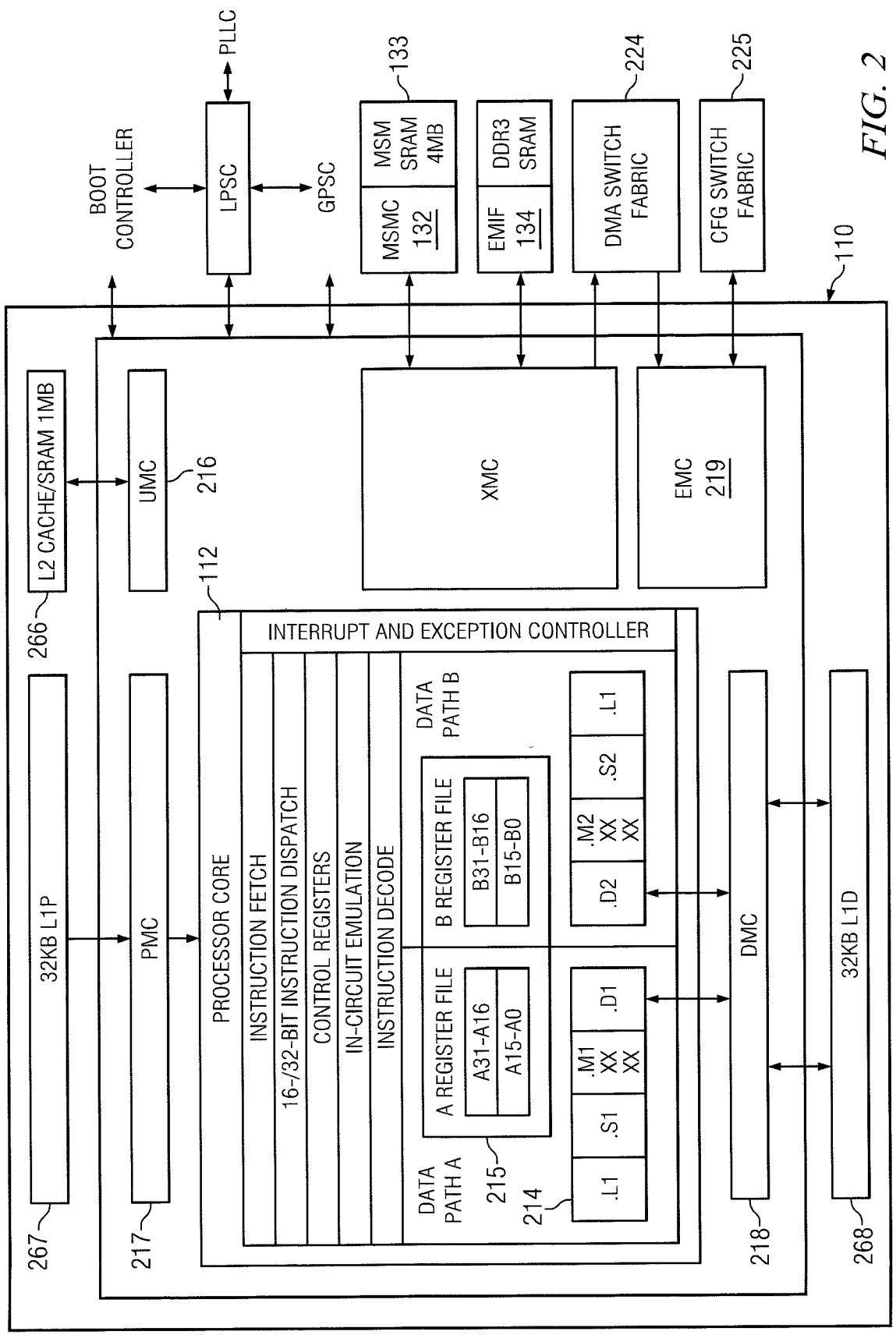
FIG. 2 is a more detailed block diagram of one processing module used in the SoC of FIG. 1.

FIG. 2 is a more detailed block diagram of one processing module 110 used in the SoC of FIG. 1. As mentioned above, SoC 100 contains two switch fabrics that form the packet based fabric 120 through which masters and slaves communicate. A data switch fabric 224, known as the data switched central resource (SCR), is a high-throughput interconnect mainly used to move data across the system. The data SCR is further divided into two smaller SCRs. One connects very high speed masters to slaves via 256-bit data buses running at a DSP/2 frequency. The other connects masters to slaves via 128-bit data buses running at a DSP/3 frequency. Peripherals that match the native bus width of the SCR it is coupled to can connect directly to the data SCR; other peripherals require a bridge.

A configuration switch fabric 225, also known as the configuration switch central resource (SCR), is mainly used to access peripheral registers. The configuration SCR connects the each processor module 110 and masters on the data switch fabric to slaves via 32-bit configuration buses running at a DSP/3 frequency. As with the data SCR, some peripherals require the use of a bridge to interface to the configuration SCR.

Bridges perform a variety of functions:
Conversion between configuration bus and data bus.
Width conversion between peripheral bus width and SCR bus width.
Frequency conversion between peripheral bus frequency and SCR bus frequency.

The priority level of all master peripheral traffic is defined at the boundary of switch fabric 120. User programmable priority registers are present to allow software configuration of the data traffic through the switch fabric. In this embodiment, a lower number means higher priority. For example: PRI=000b=urgent, PRI=111b=low.

All other masters provide their priority directly and do not need a default priority setting. Examples include the processor module 110, whose priorities are set through software in a unified memory controller (UMC) 216 control registers. All the Packet DMA based peripherals also have internal registers to define the priority level of their initiated transactions.

DSP processor core 112 includes eight functional units 214, two register files 215, and two data paths. The two general-purpose register files 215 (A and B) each contain 32 32-bit registers for a total of 64 registers. The general-purpose registers can be used for data or can be data address pointers. The data types supported include packed 8-bit data, packed 16-bit data, 32-bit data, 40-bit data, and 64-bit data. Multiplies also support 128-bit data. 40-bit-long or 64-bit-long values are stored in register pairs, with the 32 LSBs of data placed in an even register and the remaining 8 or 32 MSBs in the next upper register (which is always an odd-numbered register). 128-bit data values are stored in register quadruplets, with the 32 LSBs of data placed in a register that is a multiple of 4 and the remaining 96 MSBs in the next 3 upper registers.

The eight functional units 214 (.M1, L1, .D1, .S1, .M2, .L2, .D2, and .S2) are each capable of executing one instruction every clock cycle. The .M functional units perform all multiply operations. The .S and .L units perform a general set of arithmetic, logical, and branch functions. The .D units primarily load data from memory to the register file and store results from the register file into memory. Each .M unit can perform one of the following fixed-point operations each clock cycle: four 32×32 bit multiplies, sixteen 16×16 bit multiplies, four 16×32 bit multiplies, four 8×8 bit multiplies, four 8×8 bit multiplies with add operations, and four 16×16 multiplies with add/subtract capabilities. There is also support for Galois field multiplication for 8-bit and 32-bit data. Many communications algorithms such as FFTs and modems require complex multiplication. Each .M unit can perform one 16×16 bit complex multiply with or without rounding capabilities, two 16×16 bit complex multiplies with rounding capability, and a 32×32 bit complex multiply with rounding capability. The .M unit can also perform two 16×16 bit and one 32×32 bit complex multiply instructions that multiply a complex number with a complex conjugate of another number with rounding capability.

Communication signal processing also requires an extensive use of matrix operations. Each .M unit is capable of multiplying a [1×2] complex vector by a [2×2] complex matrix per cycle with or without rounding capability. Another version of the .M unit may allow multiplication of the conjugate of a [1×2] vector with a [2×2] complex matrix. Each .M unit also includes IEEE floating-point multiplication operations, which includes one single-precision multiply each cycle and one double-precision multiply every 4 cycles. There is also a mixed-precision multiply that allows multiplication of a single-precision value by a double-precision value and an operation allowing multiplication of two single-precision numbers resulting in a double-precision number. Each .M unit can also perform one the following floating-point operations each clock cycle: one, two, or four single-precision multiplies or a complex single-precision multiply.

The .L and .S units support up to 64-bit operands. This allows for arithmetic, logical, and data packing instructions to allow parallel operations per cycle.

An MFENCE instruction is provided that will create a processor stall until the completion of all the processor-triggered memory transactions, including:
Cache line fills
Writes from L1D to L2 or from the processor module to MSMC and/or other system endpoints
Victim write backs
Block or global coherence operation
Cache mode changes
Outstanding XMC prefetch requests.

The MFENCE instruction is useful as a simple mechanism for programs to wait for these requests to reach their endpoint. It also provides ordering guarantees for writes arriving at a single endpoint via multiple paths, multiprocessor algorithms that depend on ordering, and manual coherence operations.

Each processor module 110 in this embodiment contains a 1024 KB level-2 memory (L2) controller 216, a 32 KB level-1 program memory (L1P) controller 217, and a 32 KB level-1 data memory (L1D) controller 218. The device also contains a 4096 KB multi-core shared memory (MSM) 132. All memory in SoC 100 has a unique location in the memory map.

Figure 3:
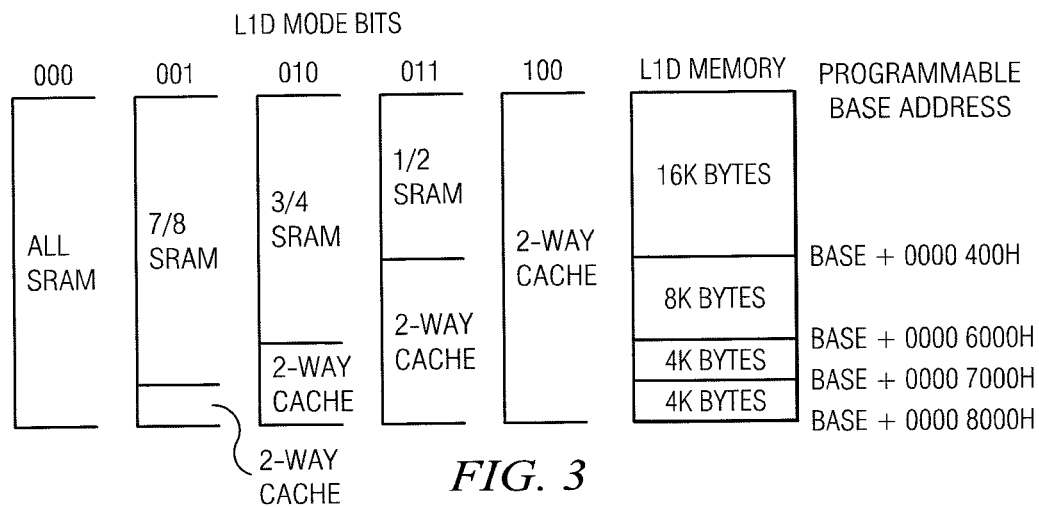
FIGS. 3 and 4 illustrate configuration of the L1 and L2 caches.

The L1P cache 267 and LD cache 266 can be reconfigured via software through the L1PMODE field of the L1P Configuration Register (L1PCFG) and the L1DMODE field of the L1D Configuration Register (L1DCFG) of each processor module 110 to be all SRAM, all cache memory, or various combinations as illustrated in FIG. 3, which illustrates an L1D configuration; L1P configuration is similar. L1D is a two-way set-associative cache, while L1P is a direct-mapped cache.

Figure 4:
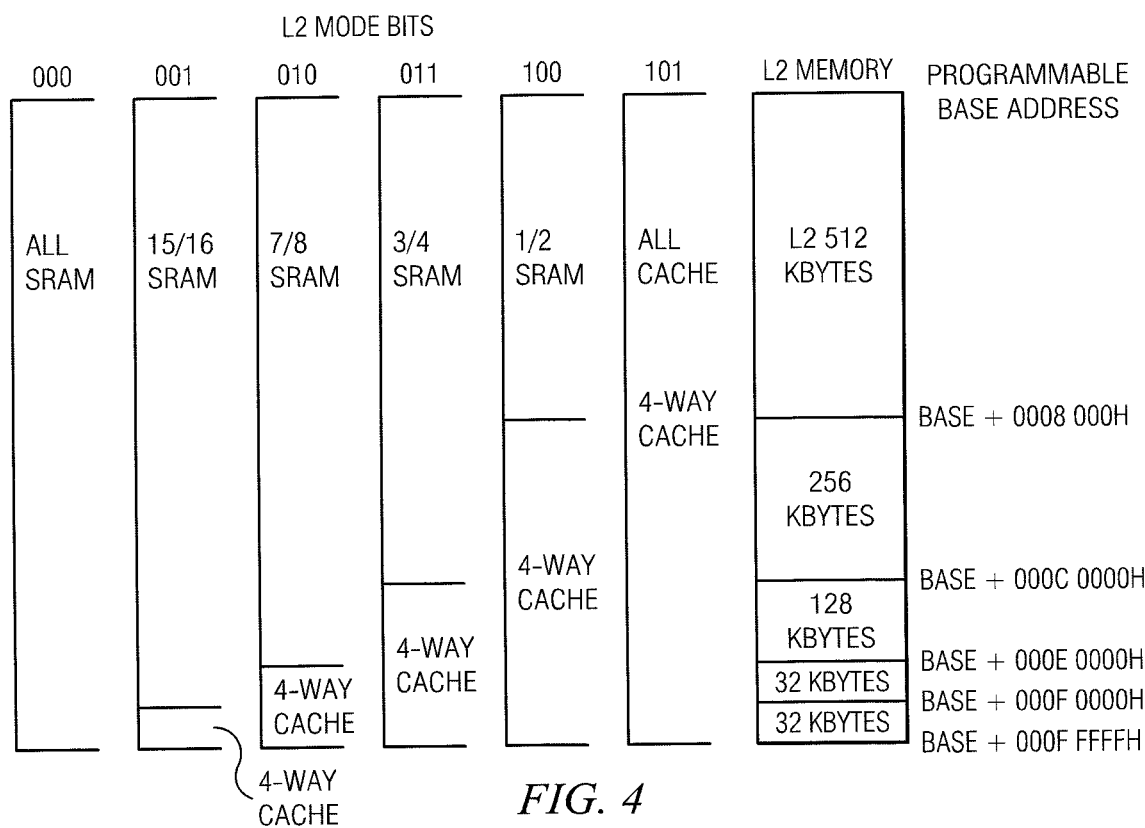

L2 memory 268 can be configured as all SRAM, all 4-way set-associative cache, or a mix of the two, as illustrated in FIG. 4. The amount of L2 memory that is configured as cache is controlled through the L2MODE field of the L2 Configuration Register (L2CFG) of each processor module 110.

Global addresses are accessible to all masters in the system. In addition, local memory can be accessed directly by the associated processor through aliased addresses, where the eight MSBs are masked to zero. The aliasing is handled within each processor module 110 and allows for common code to be run unmodified on multiple cores. For example, address location 0x10800000 is the global base address for processor module 0's L2 memory. DSP Core 0 can access this location by either using 0x10800000 or 0x00800000. Any other master in SoC 100 must use 0x10800000 only. Conversely, 0x00800000 can by used by any of the cores as their own L2 base addresses.

Level 1 program (L1P) memory controller (PMC) 217 controls program cache memory 267 and includes memory protection and bandwidth management. Level 1 data (L1D) memory controller (DMC) 218 controls data cache memory 268 and includes memory protection and bandwidth management. Level 2 (L2) memory controller, unified memory controller (UMC) 216 controls L2 cache memory 266 and includes memory protection and bandwidth management. External memory controller (EMC) 219 includes Internal DMA (IDMA) and a slave DMA (SDMA) interface that is coupled to data switch fabric 224. The EMC is coupled to configuration switch fabric 225. Extended memory controller (XMC) is coupled to MSMC 132 and to dual data rate 3 (DDR3) external memory controller 134. The XMC provides L2 prefetching for L2 cache 216/266.

Figure 5:
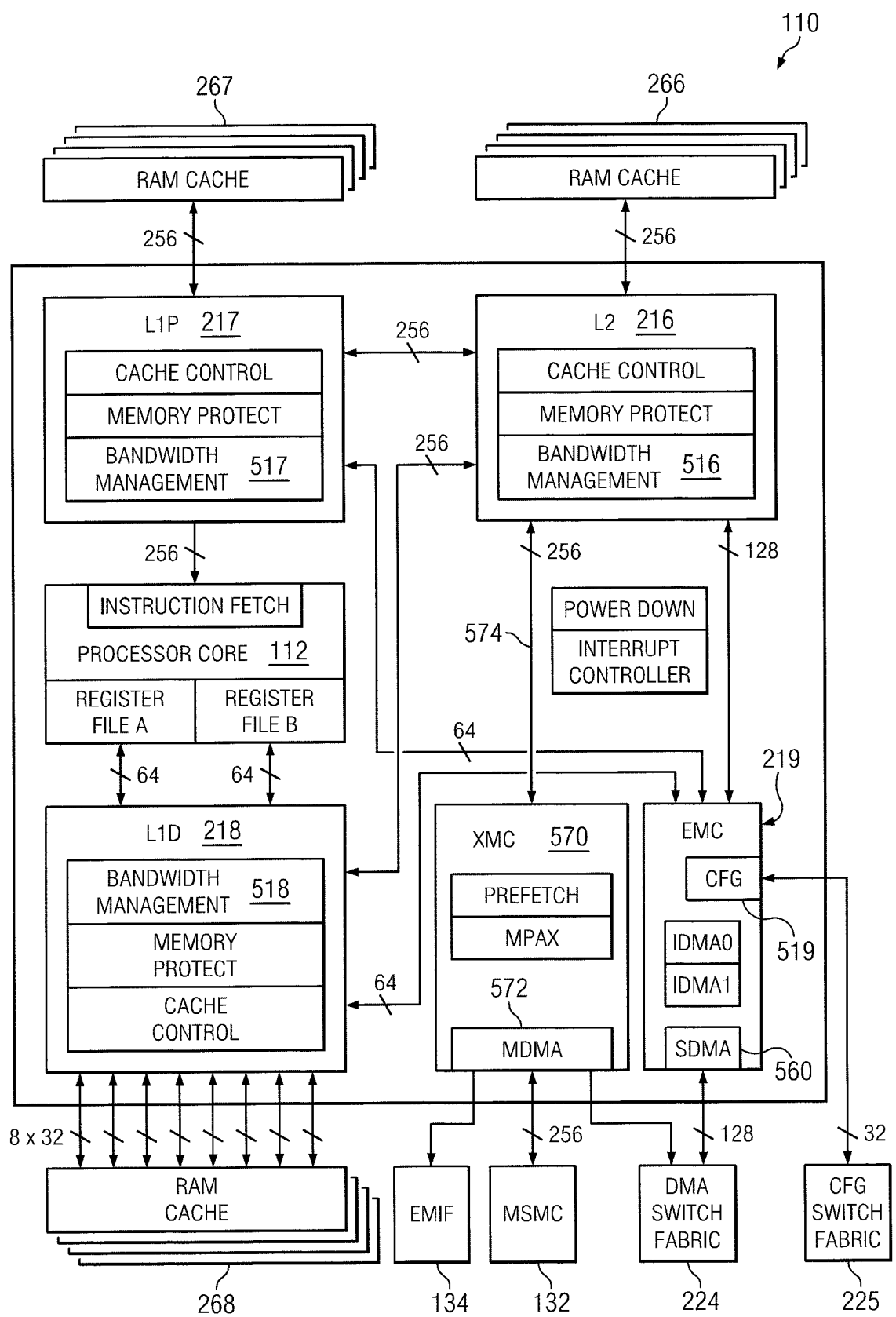
FIG. 5 is a more detailed block diagram of one processing module used in the SoC of FIG. 1.

FIG. 5 is a more detailed block diagram of one processing module 110 used in the SoC of FIG. 1 that illustrates distributed bandwidth management. When multiple requestors contend for a single processor module 110 resource, the conflict is resolved by granting access to the highest priority requestor. The following four resources are managed by the bandwidth management control hardware 516-519:

Level 1 Program (L1P) SRAM/Cache 217
Level 1 Data (L1D) SRAM/Cache 218
Level 2 (L2) SRAM/Cache 216
EMC 219

The priority level for operations initiated within the processor module 110 are declared through registers within each processor module 110. These operations are:

DSP-initiated transfers
User-programmed cache coherency operations
IDMA-initiated transfers The priority level for operations initiated outside the processor modules 110 by system peripherals is declared through the Priority Allocation Register (PRI_ALLOC). System peripherals that are not associated with a field in PRI_ALLOC may have their own registers to program their priorities.

Priority Elevation

Figure 6:
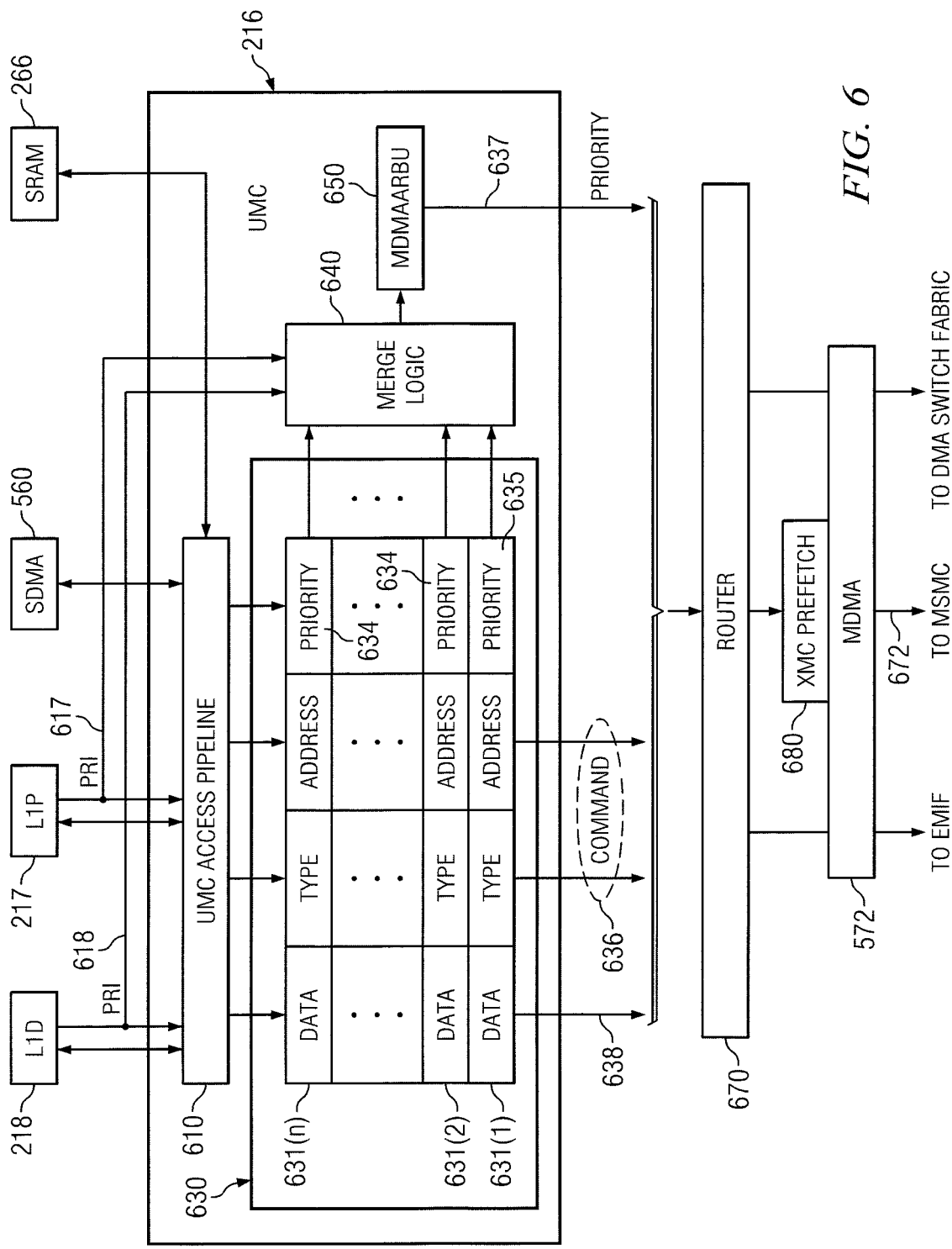
FIG. 6 is a block diagram illustrating a transaction request pipeline that performs priority elevation.

FIG. 6 is a block diagram illustrating a transaction request pipeline 630 that may perform priority elevation within UMC 216. Each core 110 implements a notion of "elevated priority" for requests it sends externally. In this embodiment, a given request may have one of two priority levels: normal or urgent. Elevated priority in this embodiment only affects requests sent outside a given core 110. It does not change the arbitration rules inside the core.

As mentioned earlier, each core 110 includes a processor 112 and a memory hierarchy that includes a Level 1 Data Memory Controller (DMC) 218, a Level 1 Program Memory Controller (PMC) 217, and a Level 2 Unified Memory Controller (UMC) 216. The PMC 217 and DMC 218 each provide a priority value 617, 618 individually and report this status to UMC 216. Each access request from PMC 217 and DMC 218 is processed in UMC pipeline 610 to check access tags for L2 cache memory 266. If the requested data is not present in L2 SRAM 266, then an access request is made to L3 shared memory system 130 via XMC 570 by sending transaction requests to MSMC 132. XMC prefetch engine 680 may perform prefetch transactions to the MSMC for requests it receives from router 670.

Each access request that needs to be routed external to core 110 is placed into a pipeline 630 that may have one or more stages 631(1)-631(n). Each stage 631(N) has a priority field 634/635 that indicates the original priority assigned to each access request by PMC 217, DMC 218 and UMC 216. Merge logic 640 then collects priority elevation status with the information from DMC and PMC to compute a final priority elevation status. This final priority elevation status is used to consult a programmable configuration register 650 to select the elevated priority 637 that is presented on the MDMA interface.

DMC 218 may elevate its priority if its pipeline contains any known cacheable read allocate requests. A DMC lookahead priority scheme considers the transaction currently on the bus interface to the UMC, as well as younger transactions in its pipeline that have already consulted the cache tag ram. If any of these transactions is a read allocate request, DMC 218 elevates its priority 618 to UMC 216.

PMC 217 may elevate its priority 617 for fetch requests to branch target addresses. Since more than one transaction request is required to fill an LIP cache memory 268 line when a miss occurs due to a branch, the transaction request for the branch target may be elevated while the remainder of the requests to fill the cache line is performed at normal priority.

In a similar manner, UMC 216 may elevate its priority for a critical portion of an L2 fetch in response to an L2 cache miss. The remainder of the requests for the L2 cache line may then be performed at normal priority.

All other requests from PMC, DMC and UMC may proceed with normal priority.

Lookahead merge logic 640 considers the following transactions when deciding whether to elevate its priority: all transactions in the UMC pipeline 610, 630; a single transaction being requested by the DMC but not yet accepted by UMC; a single transaction being requested by the PMC but not yet accepted by UMC; and the oldest transaction 631(1) currently ready to be output on the MDMA interface 572.

In this embodiment, all transactions under consideration are categorized as urgent or non-urgent. An urgent transaction is one of the following: L1D read miss; L1P fetch for a branch target; critical portion of an L2 allocate. The presence of a single urgent request in the UMC transaction scope results in the elevation of the UMC priority.

MDMAARBU Configuration Register for Programming Priority Values

Figure 7:
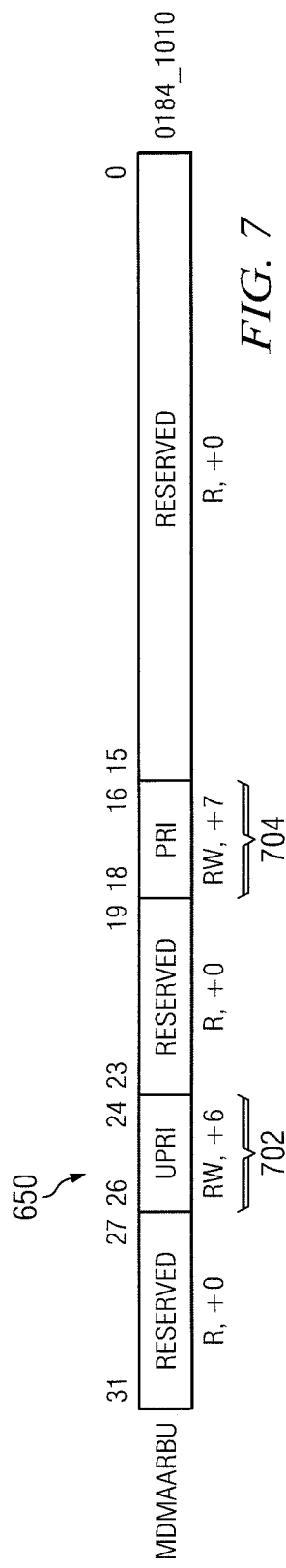
FIG. 7 illustrates a register used to indicate multiple priority values.

FIG. 7 illustrates a memory mapped configuration register 650 used to indicate multiple priority values, referred to as the MDMAARBU (MDMA ARBitration for Unified memory controller) register. This register contains the priority levels UMC uses when asserting requests on the MDMA interface. Field 702 is a three bit field that holds the urgent priority value. In SoC 100, priority may be any value from 0-7, where zero is the highest priority. Field 704 is a three bit field that holds the normal priority value. MDMAARBU register 650 may be programmed with various priority values by an application program being executed on processor 112 of core 110. Since all memory addresses in SoC 100 are global, a program being executed in one core 110 may adjust the MDMAARBU registers in other cores.

Referring again to FIG. 6, after completing its lookahead merge, merge control logic 640 decides whether the priority of the current request 631(1) provided to the MDMA interface 572 should be elevated. If there are no pending requests on the MDMA interface a lowest priority value of 7 is output on priority signal 637. If the decision is to elevate priority, then the Urgent Priority (UPRI) field 702 of the MDMAARBU register is used. If the decision is not to elevate priority, then the PRI field 704 of the MDMAARBU register is used.

The oldest transaction request 631(1) is then output to router 670. Each transaction request includes a command part 636, a data part 638 if it is a write, and priority value 637. Router 670 then routes the transaction request to the appropriate interconnect fabric based on the value of the address in command 636. For example, if the transaction requested is addressed to shared memory 133, then it will be routed to the MSMC via link 672.

In this manner, transactions within the memory system hierarchy of each core 110 are classified as high and low priority based on functionality. A hierarchical lookahead priority scheme is described, where the individual elevated priority status of each memory controller in the hierarchy is combined to form a single elevated priority for the entire memory system of the core 110. A lookahead priority collection mechanism is provided for individual memory controllers in the memory hierarchy whereby the presence of a single high priority in-flight or pending transaction results in the priority of the memory controller as a whole indicating "elevated" priority. In another embodiment, there may be more priority levels than just normal and urgent tracked in a transaction request queue.

Figure 8:
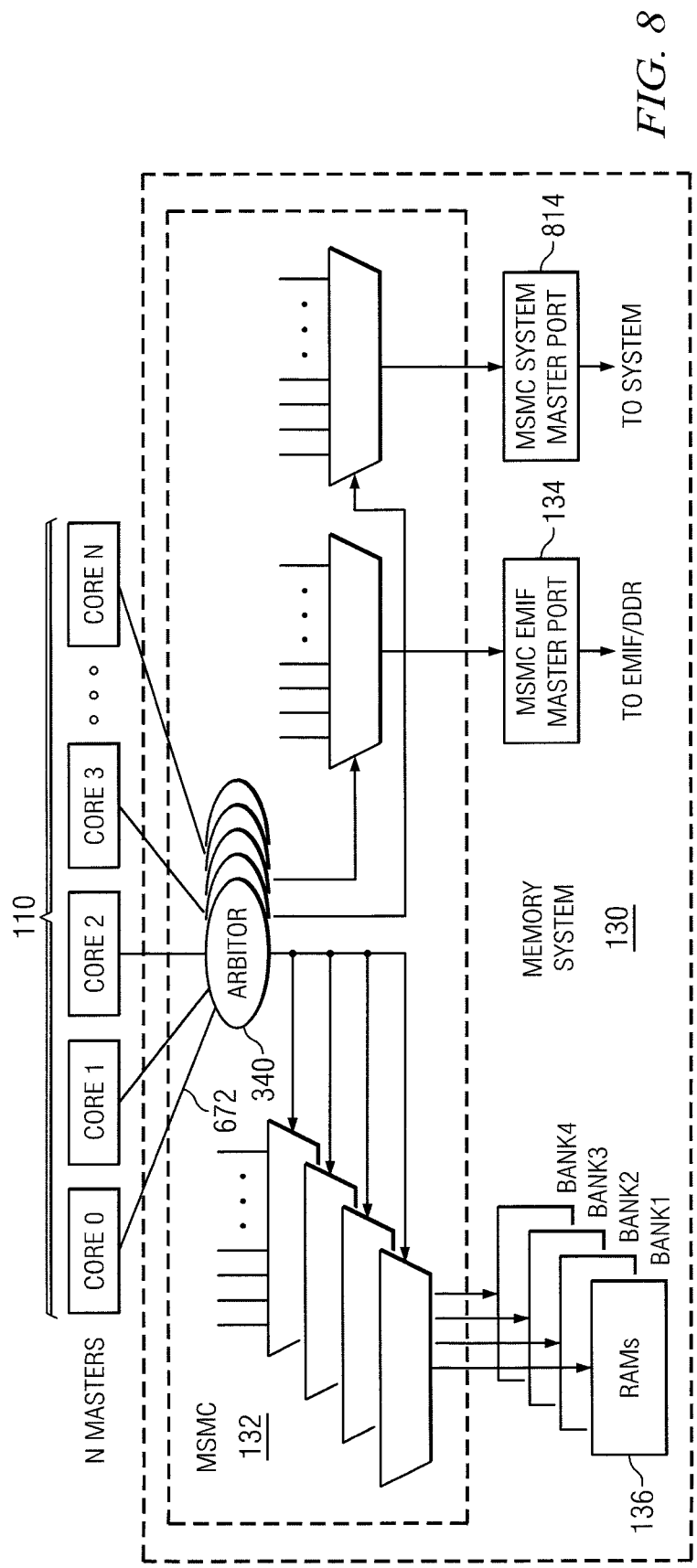
FIG. 8 is a block diagram illustrating arbitration between multiple requestors for shared resources in a shared memory system of the SoC of FIG. 1.

FIG. 8 is a block diagram illustrating arbitration between multiple requestors for shared resources in shared memory system 130. Each of the plurality of cores 110 has a dedicated link 672 from router 670 in the XMC 570 of each core 110 to a slave port on MSMC 132. As described above, each link 672 provides transaction requests that include a command, priority and data if it is a write request. The priority for each transaction request on each link 672 is determined as described above and may be elevated when a pending access occurs in an access pipeline of any of the cores 110. Each requesting slave interface is designed to present only one access request among all endpoint arbiters in a given cycle so that the return path for reads is reserved at the time a command wins arbitration.

Each endpoint in MSMC 132 has an associated arbiter 340; there is an arbiter 340 for each memory bank 136 of shared memory 133 and one each for system master port 814 and EMIF master port 134. For each access to an endpoint, the arbitration logic utilizes a dynamic multi-level priority scheme that attempts to fairly allocate the number of access opportunities and bandwidth among the requestors. Each endpoint arbiter may include additional arbitration logic specific to the requirements of that endpoint.

Figure 9:
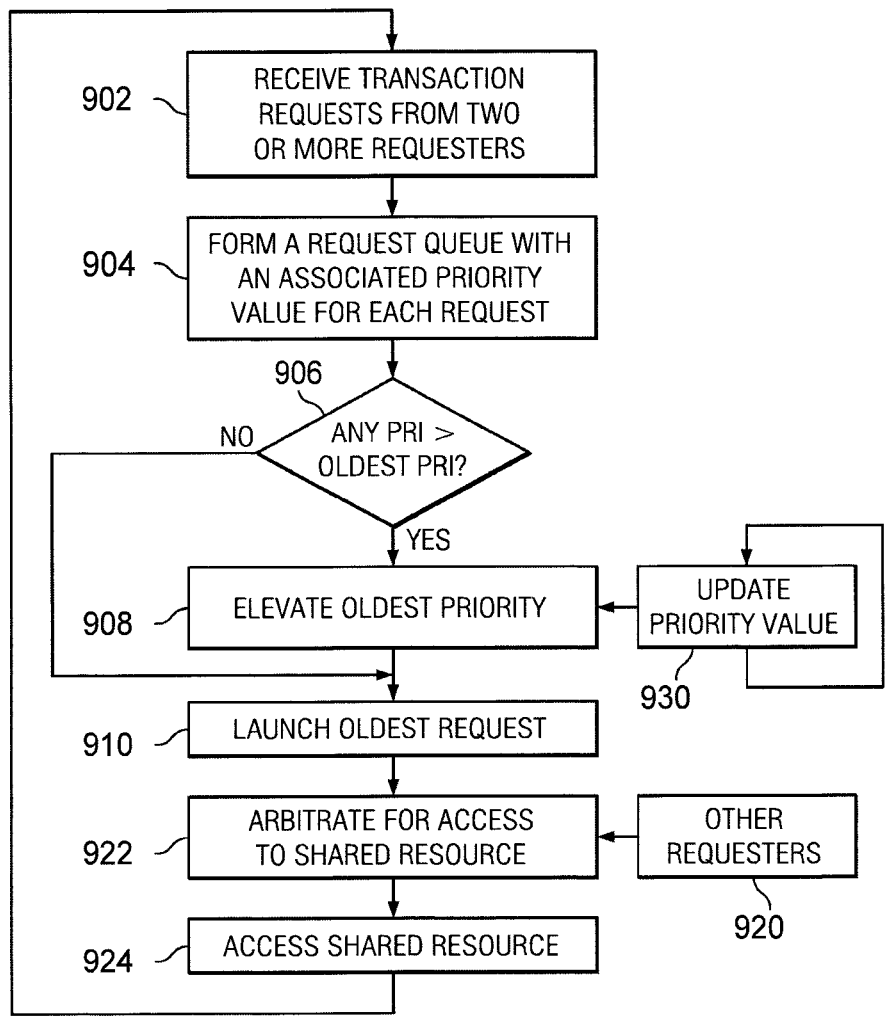
FIG. 9 is a flow diagram illustrating operation of priority elevation in a queuing requester.

FIG. 9 is a flow diagram illustrating operation of priority elevation in a queuing requester, such as the queuing requester illustrated in FIG. 6. Within a given module, such as core module 110, there may be several independent device that request memory transactions in a hierarchical manner, such as an L1 program cache, an L1 data cache, an L2 cache controller, a DMA engine, etc. Transaction requests from each independent device is received 902 by a queuing requester and then formed 904 into a request queue. As described in more detail above, each request includes a priority value that is included in the queue. In some embodiments, this may be a multi-bit value. In other embodiments, it may be a simple single bit value that indicates normal or urgent, for example.

The requests are ordered in the request queue, such that the oldest request is the next request that is issued from the queuing requester for accessing a shared resource. As requests are received for the queuing requester, the priority value of each queued request is examined to determine 906 the highest priority value of all pending transaction requests within the request queue.

Whenever one of the pending transactions within the queue or that is about to enter the queue has a priority that is higher than the oldest priority value in the queue, the priority value for queue is elevated 908 by selecting a higher priority value.

In some embodiments, determining 906 the highest priority value may include one or more transaction requests that are not yet included in the transaction queue 904.

The oldest transaction from the queue is then provided 910 to the memory system using the selected priority value. In this manner, a high priority value is selected when any transaction request in the transaction queue has an urgent priority value, and a low priority value is selected when all transaction requests in the transaction queue have a normal priority value, for example. Other embodiments may use more than urgent and normal priority values in the queue.

A lowest priority value may be selected when there are no transaction requests in the transaction queue.

Periodically, typically once each clock cycle, pending transaction requests from the queuing requester 910 and from one or more other requestors 920 are arbitrated 922 using the selected priority value for the pending request from the queuing requester. One or more of the other requesters 920 may also be queuing requesters that each includes a selected priority value that may be elevated for urgent requests.

After each arbitration contest, the winner of the arbitration contest is granted access 924 to the shared memory system.

As mentioned in more detail above, a register or other means may be provided to allow a program to dynamically update 930 a defined high priority value to use as an elevated priority value and a low priority value to use as a non-elevated priority value.

System Example

Figure 10:
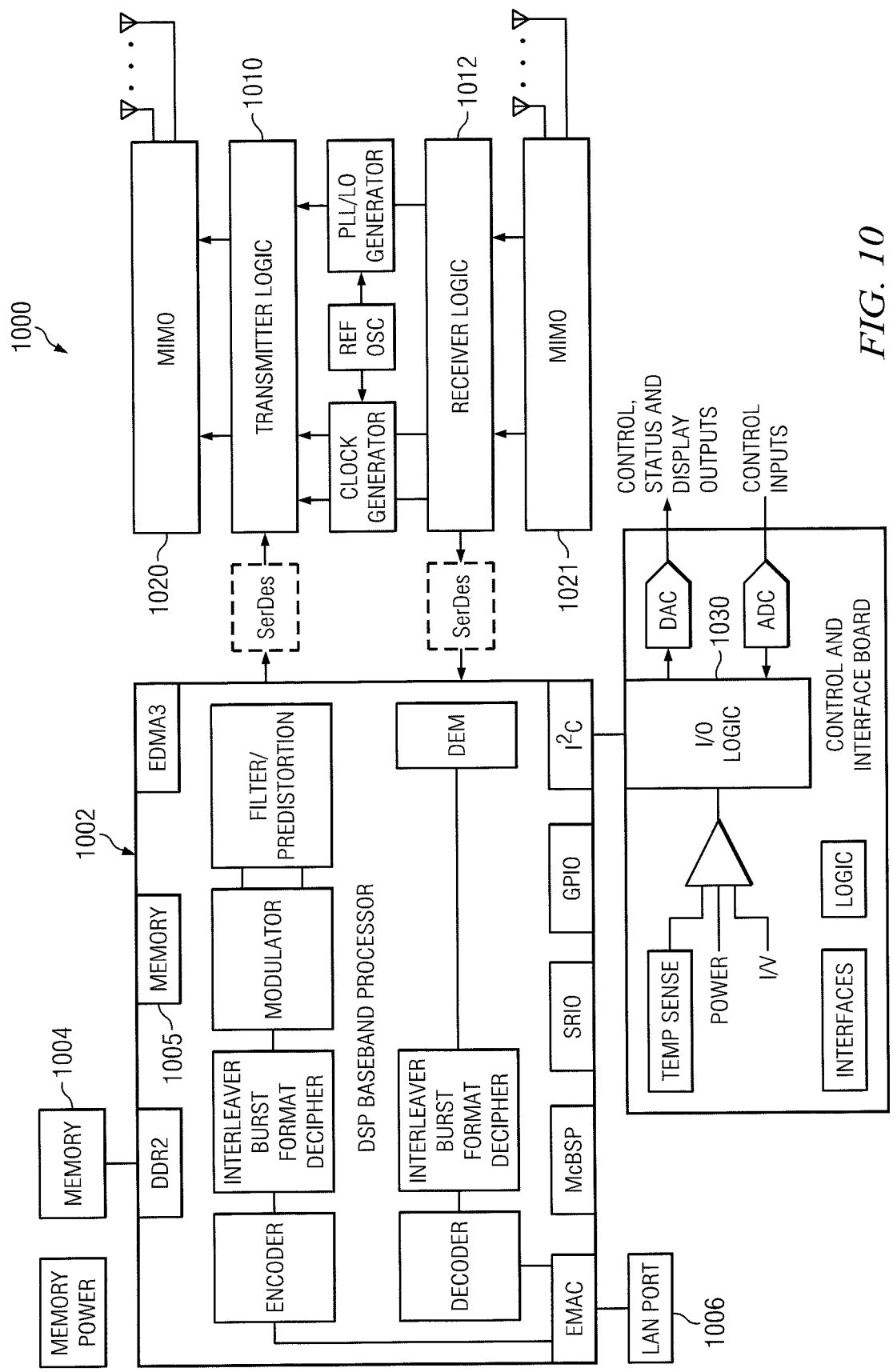
FIG. 10 is a block diagram of a system that includes the SoC of FIG. 1.

FIG. 10 is a block diagram of a base station 1000 for use in a radio network, such as a cell phone network. SoC 1002 is similar to the SoC of FIG. 1 and is coupled to external memory 1004 that may be used, in addition to the internal memory 1005 within SoC 1002, to store application programs and data being processed by SoC 1002. Transmitter logic 1010 performs digital to analog conversion of digital data streams transferred by the external DMA (EDMA3) controller and then performs modulation of a carrier signal from a phase locked loop generator (PLL). The modulated carrier is then coupled to multiple output antenna array 1020. Receiver logic 1012 receives radio signals from multiple input antenna array 1021, amplifies them in a low noise amplifier and then converts them to digital a stream of data that is transferred to SoC 1002 under control of external DMA EDMA3. There may be multiple copies of transmitter logic 1010 and receiver logic 1012 to support multiple antennas.

The Ethernet media access controller (EMAC) module in SoC 1002 is coupled to a local area network port 1006 which MAY supply data for transmission and may transport received data to other systems that may be coupled to the internet.

An application program executed on one or more of the processor modules within SoC 1002 encodes data received from the internet, interleaves it, modulates it and then filters and pre-distorts it to match the characteristics of the transmitter logic 1010. Another application program executed on one or more of the processor modules within SoC 1002 demodulates the digitized radio signal received from receiver logic 1012, deciphers burst formats, and decodes the resulting digital data stream and then directs the recovered digital data stream to the internet via the EMAC internet interface. The details of digital transmission and reception are well known.

By making use of elevated priority for transaction requests for critical transaction requests to memory 1004 and memory 1005 by the processor modules of SoC 1002, data drops are avoided while transferring the time critical transmission data to and from the transmitter and receiver logic.

Input/output logic 1030 may be coupled to SoC 1002 via the inter-integrated circuit (I2C) interface to provide control, status, and display outputs to a user interface and to receive control inputs from the user interface. The user interface may include a human readable media such as a display screen, indicator lights, etc. It may include input devices such as a keyboard, pointing device, etc.

Other Embodiments

Although the invention finds particular application to Digital Signal Processors (DSPs), implemented, for example, in a System on a Chip (SoC), it also finds application to other forms of processors. A SoC may contain one or more megacells or modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, in another embodiment, the transaction request queue may be longer or shorter than described here. In another embodiment, there may be multiple layers of queues that each performs priority elevation. The priority values may cover a wider range of values than just urgent or normal. The selected priority may have a value that has more or less than three bits, for example.

In another embodiment, the shared resource may be just a memory that is not part of a cache. The shared resource may by any type of storage device or functional device that may be accessed by multiple masters in which an urgent request in a request queue in one master needs to be elevated above requests from another master.

In another embodiment, there may be more or fewer cores used than described herein. The may be arranged in different configurations and topologies than described herein.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A system-on-a-chip comprising:
a set of processing cores;
a shared memory;
an interconnect coupling the set of processing cores to the shared memory, wherein each of the set of processing cores includes:
a memory controller coupled to the interconnect that includes:
a pipeline that includes registers to store a set of transaction requests and a set of priorities associated with the set of transaction requests, wherein the pipeline is configured to provide a first transaction request of the set of transaction requests to the interconnect; and
merge logic coupled to the pipeline and configured to cause an external priority to be provided to the interconnect along with the first transaction request such that:
when a second priority associated with a second transaction request of the set of transaction requests is greater than a first priority associated with the first transaction request, cause the external priority to be based on the second priority; and
when the second priority is not greater than the first priority, cause the external priority to be based on the first priority of the first transaction request.

2. The system-on-a-chip of claim 1, wherein:
the memory controller includes a configuration register configured to store a set of external priority values; and
the merge logic is configured to:
cause the external priority to be selected from among the set of external priority values; and
cause the configuration register to provide the external priority to the interconnect along with the first transaction request.

3. The system-on-a-chip of claim 2, wherein the set of external priority values includes a normal priority value and an urgent priority value.

4. The system-on-a-chip of claim 3, wherein:
the first priority of the first transaction request is associated with the normal priority value; and
the merge logic is configured to cause the urgent priority value to be selected as the external priority based on the second priority being greater than the first priority.

5. The system-on-a-chip of claim 2, wherein:
a first core of the set of processing cores includes a level 1 cache memory; and
the merge logic of the first core is configured to cause the external priority to be selected as a highest priority of the set of external priority values based on the second transaction request including a fetch request to a branch target address from the level 1 cache memory.

6. The system-on-a-chip of claim 2, wherein:
a first core of the set of processing cores includes a level 1 cache memory; and
the merge logic of the first core is configured to cause the external priority to be selected as a highest priority of the set of external priority values based on the second transaction request including a read allocate request from the level 1 cache memory.

7. The system-on-a-chip of claim 2, wherein:
a first core of the set of processing cores includes a level 2 cache memory; and
the merge logic of the first core is configured to cause the external priority to be selected as a highest priority of the set of external priority values based on the second transaction request including a fetch in response to a miss in the level 2 cache memory.

8. The system-on-a-chip of claim 1, wherein the merge logic is configured to:
determine the second transaction request to have a greatest priority from among the set of transaction requests; and
compare the first priority to the second priority based on the second transaction request having the greatest priority from among the set of transaction requests.

9. A circuit comprising:
a core that includes a controller configured to couple the core to an interconnect, wherein the controller includes:
a pipeline component configured to:
receive a first transaction request, a first priority associated with the first transaction request, a second transaction request, and a second priority associated with the second transaction request;
store the first and second transaction requests and the first and second priorities; and
provide the first transaction request to the interconnect;
merge logic coupled to the pipeline component and configured to:
compare the first priority to the second priority; and
cause an external priority to be provided to the interconnect that is associated with the first transaction request such that:
when the second priority is greater than the first priority, cause the external priority to be based on the second priority of the second transaction request; and
when the second priority is not greater than the first priority, cause the external priority to be based on the first priority of the first transaction request.

10. The circuit of claim 9 further comprising a configuration register configured to store a set of external priority values, wherein the merge logic is configured to:
cause the external priority to be selected from among the set of external priority values; and
cause the configuration register to provide the external priority to the interconnect along with the first transaction request.

11. The circuit of claim 9, wherein:
the pipeline component includes a set of registers configured to store a set of transaction requests that includes the first and second transaction requests and a set of priorities that includes the first and second priorities; and the merge logic is configured to:
determine the second transaction request to have a greatest priority from among the set of transaction requests; and
compare the first priority to the second priority based on the second transaction request having the greatest priority from among the set of transaction requests.

12. The circuit of claim 9 further comprising a level 1 cache memory, wherein:
the external priority associated with the first transaction request is a first external priority;
the pipeline component is configured to receive a third transaction request and a fourth transaction request;
the merge logic is configured to cause a second external priority to be provided to the interconnect that is associated with the third transaction request; and
the second external priority is based on the fourth transaction request including a fetch request to a branch target address from the level 1 cache memory.

13. The circuit of claim 9 further comprising a level 1 cache memory, wherein:
the external priority associated with the first transaction request is a first external priority;
the pipeline component is configured to receive a third transaction request and a fourth transaction request;
the merge logic is configured to cause a second external priority to be provided to the interconnect that is associated with the third transaction request; and
the second external priority is based on the fourth transaction request including a read allocate request from the level 1 cache memory.

14. The circuit of claim 9 further comprising a level 2 cache memory, wherein:
the external priority associated with the first transaction request is a first external priority;
the pipeline component is configured to receive a third transaction request and a fourth transaction request;
the merge logic is configured to cause a second external priority to be provided to the interconnect that is associated with the third transaction request; and
the second external priority is based on the fourth transaction request including a fetch in response to a miss in the level 2 cache memory.

15. The circuit of claim 9 further comprising a router coupled to the controller and configured to:
couple the core to a set of interconnects that includes the interconnect;
receive the first transaction request and the external priority from the controller; and
provide the first transaction request and the external priority to the interconnect based on an address of the first transaction request.

16. A method comprising:
receiving a first transaction and a first priority associated with the first transaction;
receiving a second transaction and a second priority associated with the second transaction;
comparing the first priority to the second priority;
selecting an external priority for the first transaction based on the comparing of the first priority to the second priority such that the external priority is based on a greater of the first priority and the second priority; and
providing the first transaction and the external priority at an interconnect for transmission over the interconnect.

17. The method of claim 16 further comprising storing a set of external priority values, wherein the selecting of the external priority for the first transaction is such that:

when the second priority is greater than the first priority, a greatest value of the set of external priority values is selected for the external priority; and when the second priority is not greater than the first priority, a second value of the set of external priority values that is less than the greatest value is selected for the external priority.

18. The method of claim 16 further comprising determining the second priority to be a greatest priority from among a set of priorities, wherein the comparing of the first priority to the second priority is based on the second priority being the greatest priority from among the set of priorities.

19. The method of claim 16, wherein the external priority is a first external priority and the method further comprises:
receiving a third transaction and a fourth transaction; and
selecting a second external priority for the third transaction based on the fourth transaction including at least one of: a fetch request to a branch target address or a read allocate request.

20. The method of claim 16, wherein the external priority is a first external priority and the method further comprises:
receiving a third transaction and a fourth transaction; and
selecting a second external priority for the third transaction based on the fourth transaction including a fetch in response to a cache miss.

* * * * *